United States Patent [19]
Balkus, Jr. et al.

[11] Patent Number: 6,120,891
[45] Date of Patent: Sep. 19, 2000

[54] MESOPOROUS TRANSITION METAL OXIDE THIN FILMS AND METHODS OF MAKING AND USES THEREOF

[75] Inventors: Kenneth J. Balkus, Jr., The Colony; Mary E. Kinsel, Arlington, both of Tex.

[73] Assignee: Board of Regemts. The University of Texas System, Austin, Tex.

[21] Appl. No.: 08/960,394

[22] Filed: Oct. 29, 1997

[51] Int. Cl.[7] ................................................. B01J 29/00
[52] U.S. Cl. ........................... 428/336; 628/697; 628/701; 628/432
[58] Field of Search .................... 438/701, 697, 438/336, 432

[56] References Cited

U.S. PATENT DOCUMENTS 5,364,797  11/1994  Olson et al. ............................ 436/501
5,468,699  11/1995  Zhang et al. .

OTHER PUBLICATIONS

Beck, Vartuli, Roth, Leonowicz, Cresge, Schmitt, Chu, Olson, Sheppard, McCullen, Higgins, Schlenker, "A New Family of Mesoporous Molecular Sieves Prepared with Liquid Crystal Templates," *J. Am. Chem. Soc.,* 114:10834–10843, 1992.

Cheung and Sankur, "Growth of Thin Films by Laser–Induced Evaporation," *CRC Crit. Rev. Solid State Mat. Sci.,* 15(1):63–109, 1988.

Ciesla, Demuth, Leon, Petroff, Stucky, Unger, Schüth, "Surfactant Controlled Preparation of Mesostructured Transition–Metal Oxide Compounds," *Chem. Soc., Chem. Commun.,* 1387–1388, 1994.

Kurioka, Watanabe, Haneada, Shimanouchi, Mizushima, Kakuta, Ueno, Hanaoka, Sugi, "Preparation of Niobium Oxide Films as a Humidity Sensor," *Catalysis Today,* 16:495–501, 1993.

Ogawa, "Formation of Novel Oriented Transparent Films of Layered Silica–Surfactant Nanocomposites," *J. Am. Chem. Soc.,* 116:7941–7942, 1994.

Peachey, Dye, Ries, Warren, Olken, "Pulsed Laser Deposition of Zeolitic Thin Films: Novel Structures for Molecular Recognition," *J. Porous Mat.,* 2:331–336, 1996.

(List continued on next page.)

*Primary Examiner*—Archene Turner
*Attorney, Agent, or Firm*—Fulbright & Jaworski L.L.P.

[57] ABSTRACT

Mesoporous transition metal oxide thin films and methods for producing these films are provided. Also provided are methods of fabricating useful chemical sensors and electrochromic devices from the thin films of the invention. Certain mesoporous transition metal oxide molecular sieves may be used as targets for pulsed laser ablation under controlled atmosphere, resulting in deposition of a thin film of the target material upon a substrate of choice. The thin films possess a mesoporous structure which may be enhanced by means of a hydrothermal treatment. The thin films also may be treated with a means of removing the templating agent used during synthesis of the mesoporous target material.

23 Claims, 4 Drawing Sheets

OTHER PUBLICATIONS

Sottile, Balkus, Jr., Riley, Gnade, "Molecular Sieve Based Chemical Sensors," *Mat. Res. Soc. Symp. Proc.,* 351:263–268, 1994.

Yang, Coombs, Sokolov, Ozin, "Free–Standing and Oriented Mesoporous Silica Films Grown at the Air–Water Interface," *Nature,* 381:589–592, 1996.

Aksay, Trau, Manne, Honma, Yao, Zhou, Fenter, Eisenberger, Gruner, "Biomimetic Pathways for Assembling Inorganic Thin Films," *Science,* 273:892–898, 1996.

Antonelli, Nakahira, Ying, "Ligand–Assisted Liquid Crystal Templating in Mesoporous Niobium Oxide Molecular Sieves," *Inorg. Chem.,* 35:3126–3136, 1996.

Antonelli and Ying, "Mesoporous Materials," *Curr. Opin. Colloid and Interface Sci.,* 523–529, 1996.

Balkus, Jr. et al., "A Capacitance Type Chemical Sensor Based on $AlPo_4$–5 Molecular Sieves," *Chem. Mater.,* 9:380–386, 1997.

Balkus, Jr., Riley, Gnade, "Molecular Sieve Thin Films via Laser Ablation," *Mat. Res. Soc. Symp. Proc.,* 351:437–442, 1994.

Balkus, Jr., Sottile, Nguyen, Riley, Gnade, "Molecular Sieve Based Chemical Sensors," *Mat. Res. Soc. Symp. Proc.,* 371:33–38, 1995.

International Search Report dated Feb. 3, 1999 (PCT/US98/23052) (UTFF:076P).

MESOPOROUS TRANSITION METAL OXIDE THIN FILMS AND METHODS OF MAKING AND USES THEREOF

1.0 BACKGROUND OF THE INVENTION

1.1 Field of the Invention

The invention relates to thin films comprising mesoporous transition metal oxide materials. The invention further relates to a method of producing mesoporous transition metal oxide thin films via pulsed laser ablation of appropriate mesoporous molecular sieve targets. The invention also relates to the use of mesoporous transition metal oxide thin films produced by the method of the invention to manufacture chemical sensors and electrochromic devices.

1.2 Description of Related Art

Two classes of materials with wide ranging uses as heterogeneous catalysts, adsorption media, and as components of chemical sensors and electrochromic devices, are microporous (pore diameter<20 Å) and mesoporous (pore diameter 20 Å–500 Å) inorganic solids. The utility of these materials is a consequence of their chemical structures, which allow guest molecules access to large internal void surfaces and cavities, thereby enhancing the catalytic activity and adsorptive capacity of these materials.

Typical of the microporous materials are the aluminosilicate molecular sieves known as zeolites. In zeolites, the micropores form regular arrays of uniformly-sized channels. Zeolites can act as hosts to ionic and neutral molecular guest species. However, the usefulness of sensors and devices fabricated from zeolites and other microporous materials is generally limited to those applications where the guest or analyte molecules have sufficiently small kinetic diameters to pass through the narrow microporous void openings.

Mesoporous materials offer the advantage of larger pore sizes, making them compatible with applications such as separation or sensing of relatively large organic molecules. Typical of the mesoporous materials are amorphous or polycrystalline solids such as pillared clays and silicates. Unfortunately, the pores in these materials are often irregularly spaced and broadly distributed in size, making them ill-suited for chemical separations, sensing and other device-oriented applications.

Considerable synthetic effort has therefore been devoted to developing molecular sieve frameworks with pore diameters within the mesoporous range, and a series of mesoporous molecular sieves having a hexagonal array of uniform mesopores has recently been developed (Beck et al., 1992). These materials, designated MCM-41, are of great interest because their large and uniform pore sizes allow otherwise sterically hindered molecules facile diffusion to internal active sites. However, the MCM-41 series of molecular sieves are silicate and aluminosilicate materials, and their aluminum and silicon centers do not have variable oxidation states, thus precluding the use of these materials in display applications and related electrochromic devices.

A method of precisely controlling deposition of a well-adhered mesoporous transition metal oxide thin film having redox active metal centers would be beneficial in extending the range of thin film materials available for use in applications such as electrochromic devices, chemical separations, and chemical sensing.

2.0 SUMMARY OF THE INVENTION

The present invention provides novel mesoporous transition metal oxide thin films, as well as processes for producing these thin films. The present invention further provides methods of fabricating useful chemical sensors and electrochromic devices from the thin films of the invention.

In forming the films of the present invention, a substrate is placed on a variable temperature substrate holder within a controlled-atmosphere chamber. The substrate is usually, though not always, heated in order to facilitate bond making between reactive molecular species produced during a laser ablation process. A pulsed laser beam is then directed into the controlled-atmosphere chamber and focused such that it impinges on a target of mesoporous transition metal oxide molecular sieve material, ablating the target. During the laser ablation process, a continuous, uniform film is deposited on the surface of the substrate. The film thickness is controlled primarily by adjusting the duration of the laser ablation/deposition process. Depending on the thickness of film desired, the time of deposition can range from a few seconds to over an hour.

In general, the thickness of the films will be dictated by their intended use. For example, electrochromic applications may require an extremely thin transparent film of about 50 nm thickness or less, whereas chemical sensing applications may require a somewhat thicker film in the range of about 200 nm to about 300 nm thickness.

The thin films of the present invention possess a mesoporous structure which can be further enhanced by means of a hydrothermal treatment. If necessary, the thickness of the thin films can actually be increased by means of the hydrothermal treatment step, as explained hereinbelow. The thin films can also be treated with an acid wash or other means of removing the templating agent originally used in the synthesis of the mesoporous target material.

The advantages of this invention over current technology are several. For example, the mesoporous transition metal oxide thin films have metal centers with variable oxidation states, allowing the fine tuning of catalytic, electronic and magnetic properties of these materials. Furthermore, the thin films of the present invention are deposited from a target of the desired mesoporous material using pulsed laser ablation, allowing more precise control of deposition of well-adhered thin films as compared with methods involving growth from solution at a substrate/solution interface. Also, the thin films of this invention may be deposited onto flexible polymer substrates, in addition to conventional metal, ceramic or glass substrates, thus decreasing the total weight of sensor or display devices manufactured therefrom.

In particular, the present invention provides thin films formed from mesoporous oxides of niobium, titanium, tantalum, zirconium, cerium, tungsten, molybdenum, iron, lead, and any other mesoporous oxides of transition metals. These mesoporous oxides of transition metals include, but are not limited to, Nb-TMS1, Ti-TMS1, Ta-TMS1, Zr-TMS1, Ce-TMS1, and related mesoporous oxides of tungsten, molybdenum, iron and lead.

Thin films, as used herein, are films that measure between about 10 nm and 100 μm in thickness. In one preferred embodiment, the thin films may measure between about 200 nm and about 300 nm in thickness. In an alternative embodiment, the thin films may measure between about 10 nm and about 50 nm in thickness. The appropriate thickness of the thin film will vary according its intended use.

For example, it may be desirable to employ a thin film of a mesoporous transition metal oxide about 50 nm in thickness in electrochromic applications where the thin film should be transparent in its colorless state. In another application, it may be desirable to employ a thin film of a mesoporous transition metal oxide about 250 nm in thickness as the dielectric phase in a capacitive-type chemical sensor. In this latter application, a fine balance exists between films that are too thin, such that electrical breakdown occurs, and films that are too thick, such that the change in dielectric properties is too small to be accurately measured.

The substrates upon which the thin films may be deposited include, but are not limited to, titanium nitride-coated silicon, indium-doped tin oxide-coated glass, indium-doped tin oxide-coated polyester, and other inorganic supports such as alumina. The appropriate choice of substrate will vary according the intended use of the thin film.

The inventors contemplate that the mesoporous transition metal oxide thin films of the present invention may be employed as the dielectric phase of capacitive-type chemical sensors. These capacitive-type sensors are expected to detect adsorbed volatile compounds via specific interactions with the large surface area presented by the mesoporous films. For example, the response of capacitive-type chemical sensors can be measured by an element which detects a change in the dielectric properties of the thin film upon adsorption of analyte molecules. This information is then processed by a transducer into a readable form such as a change in capacitance. It will be appreciated by those skilled in the art that other types of chemical sensors may be fabricated using the thin films of the present invention, such as those responsive to changes in resistance, impedance, weight, and other electrochemical or optical properties. Sensors responsive to weight changes include, but are not limited to, surface accoustic wave (SAW) and quartz crystal mass (QCM) monitor-type devices.

The inventors further contemplate that the mesoporous transition metal oxide thin films of the present invention may be employed as components of electrochromic devices in which redox reactions involving the metal centers of these thin films induce a color change in the film. Such electrochromic devices may have utility in applications including, but not limited to, electrochromic displays and mirrors, smart windows, and active camouflage.

For example, electrochromic mirrors in automobiles illustrate one possible application of electrochromic devices. At night, the lights of following vehicles can cause a dazzling reflection from the driver's rearview mirror. This dazzling reflection can be prevented by use of an optically absorbing electrochromic film covering the reflecting surface. When the film is in its colorless state, the mirror functions normally. When the film is in its colored state, only a moderate amount of light is reflected. Smart windows illustrate another possible application of electrochromic devices. An entire window is coated with an electrochromic film, and this window may be darkened to reduce the flux of light or heat into, for example, a room, office or automobile. Yet another possible application of electrochromic devices is active camouflage, in which highly reflective surfaces such as windshields on, for example, aircraft, land-going vehicles, or sea-faring vessels are coated with an electrochromic film which can be darkened to decrease visibility of the aircraft, vehicle, or vessel.

Advantageously, the electrochromic devices of the present invention are expected to exhibit faster response times as compared with traditional dense phase metal oxide-based electrochromic devices. This is because the response time required for the electrochromic device to change between colored and colorless states depends on diffusion of charged species into or out of the film. The mesoporous structure of the films of the present invention are expected to allow an increase in the diffusion rate of charged species into and out of the film, compared to a dense phase metal oxide film.

In forming the mesoporous transition metal oxide thin films of the present invention, a laser ablation film deposition apparatus is used. Such an apparatus usually consists of a pulsed laser and a controlled-atmosphere chamber. The pulsed laser typically emits radiation pulses of about 14 ns duration at about 248 nm wavelength, and the repetition rate of laser pulses is typically about 10 Hz. However, the inventors contemplate that any laser which is sufficiently energetic to ablate a mesoporous transition metal oxide target may be used. The laser beam is directed into the controlled-atmosphere chamber, usually by means of a rastering mirror, and focused onto a mesoporous transition metal oxide molecular sieve target at an angle of about 45°.

The pressure in the controlled-atmosphere chamber is conveniently varied using a needle valve, or similar device for controlling or metering gas, and an oxygen source. The pressure in the controlled-atmosphere chamber may be varied between about 0.01 mTorr and about 600 mTorr, preferably between about 150 mTorr and about 300 mTorr.

By "about" is meant "approximately" or "in the vicinity of." For example, the phrase "about 150 mTorr" may mean 151, 152, 153, 154 mTorr, etc., and fractional values therebetween, and it may also mean 149, 148, 147, 146, 145 mTorr, etc., and fractional values therebetween.

The use of a gas in the ablation process mainly serves to compensate for loss of constituent oxygen in the metal oxide. In the absence of an oxygen environment, laser deposited metal oxide films tend to be deficient in oxygen. In theory, any gas that can provide oxygen atoms, for example ozone, may be useful in this regard.

A variable temperature substrate holder is located below a target holder at a distance of about 2 cm to about 5 cm. A self-supporting target is made by pressing approximately 1.0 g of as-synthesized (containing organic template) mesoporous transition metal oxide compound in a die. A target formed in this manner will typically have a diameter of about 1 inch and a thickness of about ⅛ inch.

In forming the films of the present invention, a desired substrate is placed on the variable temperature substrate holder within the controlled-atmosphere chamber. The substrate is usually, though not always, heated to facilitate bond making between reactive molecular species produced during a laser ablation process. During the laser ablation process, a continuous, uniform film is deposited on the surface of the substrate.

In one possible embodiment of the invention, mesoporous transition metal oxide thin films intended for use in chemical sensors may be grown to a thickness that ranges from about 10 nm to about 100 $\mu$m, preferably between about 200 nm and about 300 nm. The time of deposition may range from about 30 seconds to about one hour, preferably from about 15 min to about 20 min.

In another possible embodiment of the invention, mesoporous transition metal oxide thin films intended for use in electrochromic applications may be grown to a thickness of several tens of nanometers by varying the deposition time. In this embodiment, a glass substrate is usually heated to a temperature of about 250° C., and a MYLAR substrate is usually heated no higher than 80° C., preferably room temperature (approximately 25° C.) to about 30° C. An oxygen atmosphere is preferably maintained at 200–300 mTorr. The film is grown for a time ranging from about 30 seconds to a few minutes, preferably from about 2 minutes to about 4 minutes.

A thin film produced by this method is generally poorly crystalline, as determined by x-ray diffraction (XRD) analysis. Depending on the intended application of the thin film, it may be desirable to enhance or increase the crystallinity or order of the thin film using a hydrothermal treatment. A hydrothermal treatment consists of heating a thin film-coated substrate in a sol-gel mixture. The sol-gel mixture is similar or identical to that used to synthesize the mesoporous molecular sieve target material. A hydrothermal treatment of short duration results in reorganization of the thin film material, and no increase in film thickness. A longer hydrothermal treatment generates a thicker film. A short hydrothermal treatment is defined herein as one that is less than about three days in duration. A long hydrothermal treatment can last from about 3 days to about 9 days. Because the laser deposited films act as a seed layer, the thicker the laser deposited film, the quicker the molecular sieve growth. For example, a mesoporous niobium oxide thin film generated from ablating a Nb-TMS1 target can be treated in a sol gel mixture containing niobium ethoxide, dodecylamine and water for about 1 to about 3 days at a temperature of about 180° C. Such a treatment yields a Nb-TMS1-like film. By "Nb-TMS1-like film" it is meant that the film exhibits the X-ray powder diffraction patterns that would be expected for Nb-TMS1 bulk material.

The templating agent may be removed from select transition metal oxide films using an acid wash. Templating agent removal can be achieved by either calcination or washing with an acid solution. In the case of an Nb-TMS1-like film, typical template removal conditions include immersion of the thin film in 3:1 isopropanol:water acidified using $HNO_3$ to pH 1.75, stirred for approximately 3 hours. An acid wash can be shorter or longer, depending upon the stability of the supporting substrate at low pH values.

3.0 BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

4.0 DETAILED DESCRIPTION OF ILLUSTRATIVE EMBODIMENTS

Figure 1:
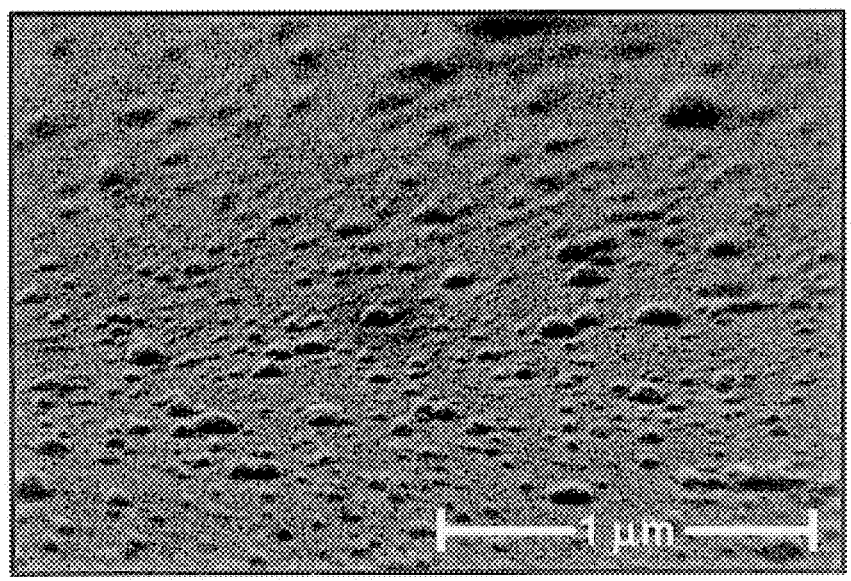
FIG. 1 is a scanning electron microscope (SEM) image of the surface morphology of a niobium oxide film deposited by pulsed laser ablation of a mesoporous Nb-TMS1 target.

This invention is generally concerned with novel mesoporous transition metal oxide thin films, as well as processes for producing these thin films. Methods of fabricating useful chemical sensors and electrochromic devices from the thin films of the invention are also provided.

A remedy to the lack of redox active metal centers in the MCM-41 series of mesoporous aluminosilicate molecular sieves is the recent successful synthesis of hexagonally packed mesoporous oxides of niobium, tungsten and other transition metals (Ciesla et al., 1994; Antonelli, Nakahira and Ying, 1996; Antonelli and Ying, 1996). The preparation of mesoporous molecular sieves from transition metal oxides represents an advance from both the catalytic and electronic standpoints, because transition metal oxides have variable oxidation states, which are lacking in aluminum and silicon oxides. These variable oxidation states are useful in tailoring the catalytic, conductive, and magnetic properties of these materials.

Fashioning thin films from mesoporous molecular sieves is a difficult challenge, yet it is also a necessary step in fully controlling the operating characteristics of devices fashioned from these materials. Mesoporous or mesostructured thin films are of great interest because of their potential usefulness as organized catalysts, membranes for biomolecule separations, membranes for gas separations, sensors for large molecules, ordered ceramic matrix composites, engineered biomaterials and mesostructured semiconductors. Several researchers have prepared thin films comprising mesoporous molecular sieves. However, all work thus far has focused on mesoporous silicates prepared from aqueous solution (Ogawa, 1994; Yang et al., 1996; Aksay et al., 1996; Olson et al.; U.S. Pat. No. 5,364,797). Controlling the morphology and thickness of mesoporous thin films prepared from aqueous solution can be problematic, at best. Furthermore, mesoporous transition metal oxide thin films prepared from aqueous solution do not always adhere well to the substrate.

A promising method for more precise control of deposition of well-adhered thin films is pulsed laser evaporation or laser ablation. The pulsed laser ablation technique has been used to deposit thin films of naturally occurring zeolites, such as mordenite and faujasite (Peachey et al., 1996), and synthetic aluminophosphate molecular sieves (Sottile et al., 1994; Balkus, Jr. et al., 1994; Balkus, Jr. et al., 1995; Balkus, Jr., Ball, and Gnade, 1997; Balkus, Jr., Ball, Gimon-Kinsel, Anthony, and Gnade, 1997). As yet, no strategies have been devised for the deposition of mesoporous transition metal oxide thin films.

In the examples that follow, a film deposition apparatus was employed which comprises a pulsed laser and a controlled-atmosphere chamber. A pulsed excimer laser (Lumonics HYPEREX 400), emitting 14 ns pulses at 248 nm wavelength, was used as the laser source, although any other laser sufficiently energetic to ablate a mesoporous transition metal oxide target could be used, as further discussed below. In the examples, the repetition rate of laser pulses was 10 Hz. The laser beam was directed into the controlled-atmosphere chamber, preferably using a rastering mirror for reasons discussed below. The laser beam was focused onto a mesoporous molecular sieve target at an angle of about 45°.

Suitable target materials for the laser ablation/deposition method of the present invention include mesoporous oxides of niobium, titanium, tantalum, zirconium, cerium, tungsten, molybdenum, iron, lead, and any other mesoporous oxides of transition metals. These mesoporous oxides of transition metals include, but are not limited to, Nb-TMS1, Ti-TMS1, Ta-TMS1, Zr-TMS1, Ce-TMS1, and related mesoporous oxides of tungsten, molybdenum, iron and lead. The designation M-TMS1, where M=Nb, Ti, Ta, Zr, Ce, and other transition metals, refers to a family of hexagonally packed mesoporous transition metal oxide molecular sieves prepared via a liquid crystal tempting process (Antonelli, Nakahira and Ying, 1996; Antonelli and Ying, 1996). Related mesoporous or mesostructured oxides of tungsten, molybdenum, iron and lead (Ciesla et al., 1994) are also suitable for use in the laser ablation/deposition method of the present invention.

Laser ablation and deposition are generally carried out at reduced pressures, although a small amount of oxygen can be introduced into the controlled-atmosphere chamber to control the stoichiometry of oxide thin films. Pressure in the controlled- atmosphere chamber may be varied between about 0.01 mTorr and 600 mTorr; in the examples which follow, pressure was typically varied between about 150 mTorr and about 350 mTorr, using a needle valve and an oxygen source. In the controlled- atmosphere chamber, a variable temperature substrate holder was located below a target holder at a distance of about 2 cm to 5 cm. The self-supporting target was typically made by pressing approximately 1.0 gram of the as-synthesized (containing organic template) mesoporous transition metal oxide compound in a die. A target formed in this manner was about 1 inch in diameter and about ⅛ inch thick.

In forming the films, a substrate was placed on the variable temperature substrate holder within the controlled-atmosphere chamber. It is usually desirable to heat the substrate in order to facilitate bond making between reactive molecular species produced during the laser ablation process. Substrate temperatures may range from room temperature or just above (about 30° C.) up to as high as 600° C.; in the examples which follow, substrate temperatures ranged from about 32° C. to about 300° C. During the laser ablation process, a continuous, uniform film was deposited on the surface of the substrate. A film can be deposited to a thickness that ranges from 10's of nanometers to 10's of micrometers, during a time of deposition that ranges from about 30 seconds to over one hour. In the following examples, films were deposited in thicknesses ranging from less than 40 nm to about 400 nm, over deposition times ranging from less than a minute to about 80 min.

The substrates most commonly used in the following examples for collecting thin films were titanium nitride (TiN)-coated silicon, indium-doped tin oxide (ITO)-coated glass, and ITO-coated MYLAR. MYLAR comprises a polyester compound and is a registered trademark of E. I. DuPont de Nemours and Company (Wilmington, Del.). Of course, other suitable substrates may be used, including alumina. It is not necessary that the substrate be coated with a conductive material.

As regards the laser ablation process itself, depending on the laser conditions, the ablation/evaporation of the target can be either thermal, nonthermal, or a mixture of the two (Cheung and Sankur, 1988). The nature of laser-solid interaction depends on many factors such as power density, pulse duration, wavelength, and thermodynamic and optical properties of the solid target. For evaporation to take place, the thermal energy density must exceed the sublimation energy of the target material in a time interval less than the duration of the laser pulse. For Q-switched lasers (pulses of $10^{-9}$ s), the minimum power density to evaporate dense packed metal phases is about $10^9$ W/cm$^2$. Less power density is required for low density phases such as mesoporous molecular sieves.

Laser-surface interaction leads to some degree of plasma formation. However, the plasma is not dense enough to shield all laser radiation. Vaporization of the target occurs as a result of the combined effect of laser-solid interaction, laser-plasma interaction, and indirect plasma-surface interaction. The ejected particles contain a mixture of ions, electrons, hyperthermal neutral atoms and molecules, neutral species in their electronically excited states, UV photons, and perhaps even soft X-rays (Cheung and Sankur, 1988). Metal oxides can be evaporated congruently, making pulsed laser evaporation an ideal process for depositing thin films in which the stoichiometry of the bulk material must be preserved.

"Splashing" is a phenomenon which can result when the laser impinges upon a rough target surface. Splashing causes the formation of particulates and, as a consequence, leads to deposition of rough and/or discontinuous films (Cheung and Sankur, 1988). As such, splashing is to be avoided. The use of a rastering mirror, which steadily moves the laser beam across the target surface, serves to ensure that the laser beam is always impinging on fresh, smooth target surface, thereby reducing splashing.

Differences in substrate or deposition conditions may account for differences in the properties of the respective thin film products. For example, the inventors have carried out pulsed laser ablation (248 nm, KrF*) of a mesoporous niobium oxide molecular sieve (Nb-TMS1) target, collecting the resultant film on a titanium nitride-coated silicon wafer substrate, under the following experimental conditions:

laser fluence=60 MW/cm$^2$
repetition rate=10 Hz
substrate temperature=125–130° C.
background pressure=150 mTorr with $O_2$
ablation time=20 min The thin film was magenta to pale gold in color when viewed normal to the substrate surface.

The inventors have also carried out pulsed laser ablation (248 nm, KrF*) of the same mesoporous niobium oxide molecular sieve (Nb-TMS1) target, collecting the resultant films on two different substrates, under the following experimental conditions:

laser fluence=60 MW/cm$^2$
repetition rate=10 Hz
substrate temperature=150–275° C.
background pressure=260 mTorr with $O_2$
ablation time=20–24 min These films were deposited on a titanium nitride-coated silicon (TiN/Si) substrate and a indium-doped tin oxide coated MYLAR (ITO/MYLAR) substrate. The thin film on TiN/Si appears magenta to pale blue in color when viewed normal to the substrate surface. In contrast, the thin film on ITO/MYLAR is transparent when viewed normal to the substrate surface. Colored bands may be observed when the film on ITO/MYLAR is viewed at an angle to the surface. Presumably this is due to differences in the refractive indices of the film as the film thickness decreases at its edges.

These films are typically characterized by X-ray diffraction (XRD), scanning electron microscopy (SEM), and Fourier transform-infrared spectroscopy (FT-IR) methods. X-ray diffraction of the Nb-TMS1 thin films shows a low angle reflection appearing at approximately 2° (2Θ)), indicating that a fraction of the ordered mesoporous structure is preserved in the thin film.

The thin films produced by the methods of this invention are generally poorly crystalline. Depending on the intended application of the thin film, it may be desirable to enhance or increase the crystallinity or order of the film by a hydrothermal treatment. Hydrothermal treatment consists of heating the thin film-coated substrate in a sol gel mixture similar or identical to that used to synthesize the original mesoporous molecular sieve target material. The sol gel mixture is composed of a transition metal source (usually a metal alkoxide) and a templating agent, preferably a long alkyl chain amine. Alkoxide sources include, but are not limited to, niobium ethoxide, titanium (IV) ethoxide, titanium isopropoxide, tantalum ethoxide, molybdenum(VI) isopropoxide and zinc isopropoxide. Amine sources include, but are not limited to, dodecylamine, tetradecylamine, hexadecylamine and octadecylamine. Relatively short hydrothermal treatments may result in reorganization of the thin film material with no increase in film thickness, whereas longer hydrothermal treatments may generate a thicker film. A short hydrothermal treatment is defined herein as less than about three days in duration. A long hydrothermal treatment can last from about 3 days to about 9 days. Because the laser deposited films act as a seed layer, the thicker the laser deposited film, the quicker the molecular sieve growth.

For example, a mesoporous niobium oxide thin film generated from ablating a Nb-TMS1 target may be treated in a solution containing niobium ethoxide, dodecylamine and water for about 1 to 3 days at a temperature of 180° C.. Such a hydrothermal treatment yields a Nb-TMS1-like film. By "Nb-TMS1-like film" it is meant that the film exhibits the X-ray powder diffraction patterns that would be expected for Nb-TMS1 bulk material.

Depending on the intended application of the thin film, it may be desirable to remove the templating agent used in synthesizing the mesoporous target material. Template removal may be achieved by either calcination or washing with an acid solution. Provided the mesoporous structure of the thin film is retained upon template removal, access to the large internal surface area of the thin film is then improved. Access to the large internal surface area of, for example, Nb-TMS1 thin films, is desirable from the standpoint of potential chemical sensor fabrication in that it allows the film to potentially differentiate amongst large organic compounds based on their steric properties (only compounds smaller than the channel openings gain access to the large internal surface area).

It should be noted that template removal is not advisable for all mesoporous transition metal oxide thin films. For example, the mesoporous tungsten oxide thin films of the examples that follow are known to be thermally unstable, and their structure will revert to a denser phase upon template removal. In the case of the Nb-TMS1-like films, typical template removal conditions are 3:1 isopropanol:water acidified using $HNO_3$ to pH 1.75, stirred for approximately 3 hours. The acid wash may be shorter or longer depending on the stability of the supporting substrate at low pH values.

Particular applications and devices based on the transition metal oxide thin films of the present invention include chemical sensors which detect adsorbed volatile compounds via specific interactions with the large surface area presented by the films. An example of a chemical sensor is a capacitive-type humidity sensing device. The response of this capacitive-type chemical sensor is measured by an element which detects a change in the dielectric properties of the hydrothermal treated thin film upon adsorption of analyte molecules. This information is then processed by a transducer into a readable form such as a change in capacitance, resistance or impedance or the like.

Dense phase niobium oxide films have been described (Kurioka et al., 1993) which have sensitivity toward adsorption and desorption of water vapor. One of the significant features of niobium oxides is the formation of strong acid sites on the surface; these sites have been ascribed to —OH groups bound to $Nb^{5+}$. The amount of surface OH groups has been reported to rapidly increase or decrease in response to the cyclic adsorption and desorption of water vapor at an ambient temperature (Kurioka et al., 1993). Surface electrical conductivities of metal oxides strongly depend on the amount of adsorbed water vapor. This provides a basis for devising a niobium oxide capacitive-type chemical sensor.

For example, absorption of dry nitrogen by the mesoporous niobium oxide thin films of the present invention yields a measured capacitance, and an increase in this capacitance is typically observed upon exposure to nitrogen plus water vapor. Comparing these responses with those observed for analogous capacitive-type sensors prepared from dense phase crystalline $Nb_2O_5$, the inventors note that the relative capacitance changes are of the same order of magnitude for the mesoporous Nb-TMS1-derived thin films and the dense phase $Nb_2O_5$ chemical sensors, although larger absolute capacitance signals are measured for the Nb-TMS1-derived devices compared to the dense phase $Nb_2O_5$ devices. This latter difference in absolute capacitance signals may be due to the increased surface area and concomitant increased adsorption capacity of the mesoporous thin films. Advantageously, these large capacitance signals of the thin film devices of the present invention are relatively easy to measure. In view of this fact and the observed capacitance change when exposed to water vapor, it is likely that mesoporous Nb-TMS1-derived thin films would be useful as an element in humidity sensors. Chemical sensors based on the ordered mesoporous transition metal oxide thin films of the present invention may also offer the ability to adsorb and detect large organic molecules (kinetic diameter$\leq 22$ Å).

Other applications contemplated by the inventors for the transition metal oxide thin films of the present invention include their use as elements of electrochromic displays and mirrors, smart windows, and active camouflage. In general, electrochromic devices have many favorable qualities including low power consumption, the memory effect, and no practical size limitation (large or small). The memory effect can be described as the production of a color change that persists with little or no additional input of power. By comparison, liquid crystal desplays (LCDs) have no memory effect and thus require the constant input of power to display their color. Electrochromic devices typically consume little power (only a few hundred millivolts) in producing a color change compared to LCD devices, which require tens of volts. In principle there is no limit to the size an electrochromic device can be. LCDs require that the glass display front face must be exactly parallel with the back plate in order to produce a uniform electric field; this requirement becomes increasingly difficult as the size of LCD device becomes larger.

Electrochromic devices based on the mesoporous transition metal oxide thin films of the present invention will exhibit faster response times as compared with traditional dense phase metal oxide-based electrochromic devices. This is because the response time required for the electrochromic device to change between colored and colorless states depends on diffusion of charged species into or out of the film. The mesoporous structure of the films of the present invention are expected to allow an increase in the diffusion rate of charged species into and out of the film, compared to a dense phase metal oxide film. In addition, the electrochromic mesoporous transition metal oxide thin films of the present invention may be deposited onto a wide variety of substrates including rigid glass or flexible MYLAR.

The electrochromic properties of a thin film may be tested experimentally by means of an electrochemical cell. For example, a meostructured tungsten oxide thin film on ITO-coated MYLAR can serve as the working electrode, a silver wire can serve as the reference electrode, and a carbon rod can serve as the counter electrode. A solution of 1M $LiClO_4$ in acetonitrile serves as a source of $Li^+$ cations. The tungsten oxide film becomes dark blue when a potential of −0.80 V (versus silver wire) is applied to the working electrode. Application of +1.0 V causes the film to revert to a colorless state. $Li^+$ cations diffuse into the film to maintain charge neutrality during reduction of the metal centers Interaction of the cations and the reduced metal centers is believed to induce formation of a new absorption band, thus resulting in a color change.

In deciding which mesoporous transition metal oxide thin films of this invention are well-suited for use in chemical sensors, and which thin films are well suited for use in electrochromic devices, the following points should be considered. The films which are chosen for fabrication and testing as chemical sensors must be structurally stable after the template is removed, because the gaseous analyte compounds need access to the large internal surface area in order to elicit a sensor response. The films which are chosen for electrochromic applications must have transition metal centers with redox potentials less negative than the redox potential of the ITO coating on the glass or MYLAR substrates. Otherwise, the ITO coating will become irreversibly reduced and colored. Also, the presence of any pin holes in the thin films of the invention may allow the diffusion of $Li^+$ ions into the reduced ITO layer beneath the thin film, thus resulting in an irreversible and undesirable coloration of the ITO.

5.0 EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

5.1 Example 1—Preparing Nb-TMS1

This example describes the preparation of a mesoporous niobium oxide molecular sieve designated Nb-TMS1 (Antonelli, Nakahira and Ying, 1996; Antonelli and Ying, 1996). This molecular sieve is suitable for use as a laser ablation target.

A mixture of niobium ethoxide (1.0 g) and dodecylamine (0.292 g) was heated with stirring for approximately 1 min at 50° C. Then 10 mL of ethanol and 10 mL deionized water were added, consecutively, to the mixture resulting in the precipitation of a white solid. The white solid was broken up with a spatula and allowed to stand in the supernatant for 72 h. The white solid and the supernatant were loaded into a 23 mL Teflon lined stainless steel autoclave and heated 24 h at 80° C., then 24 h at 100° C., followed by 7 days at 180° C. The white solid was recovered by suction filtration, and washed with deionized water, 200 mL ethanol and 200 mL diethyl ether.

The X-ray diffraction pattern of the product of this example includes a very strong relative intensity line at 28.7±0.2 Å d-spacing and a weak line at 15.4±1.6 Å d-spacing.

5.2 Example 2—Preparing Mesoporous Tungsten Oxide

This example describes the preparation of a mesoporous tungsten oxide molecular sieve (Ciesla et al., 1994). This molecular sieve is suitable for use as a laser ablation target.

A mixture of hexadecyltrimethylammonium chloride (15.0 g), ammonium metatungstenate hydrate (3.0 g) and deionized water (30.0 g) was brought to pH 6.0 using dilute ammonium hydroxide and aged for 30 min at room temperature. The white mixture was loaded into a 100 mL polypropylene bottle, sealed tightly and heated for 72 h at 90° C. The white product was suction filtered and washed copiously with deionized water.

The X-ray diffraction pattern of the product of this example includes a very strong relative intensity line at 27.7±0.5 Å d-spacing and weak lines at 14.4±1.2 and 11.72±1.7 Å d-spacing.

5.3 Example 3—Coating a TiN/Si Substrate with a Mesoporous Thin Film

In this example, thin film-coated substrates are prepared via laser ablation/deposition in the manner described hereinabove. The ablation target was prepared from the Nb-TMS1 material prepared as in Example 1. The laser ablated mesoporous material was collected on a titanium nitride (TiN)-coated silicon substrate.

Typical film growth at background oxygen pressures of 200–300 mTorr involves a large number of gas phase collisions of the ejected material during its journey from the target to the substrate. Typically, the formation of the films involves the arrival of atoms, ions and clusters at the substrate surface where processes such as migration, nucleation and film growth take place.

The thickness of the TiN layer of the substrate material is known to be 50 nm, as confirmed by SEM. In this example, the thickness of the deposited film varied from about 90 nm to about 400 nm (see Table 1), depending on the amount of time the laser ablated material was collected. Other effective means of adjusting the film thickness to the desired dimension include varying the laser fluence, target-to-substrate distance and background vacuum pressure.

The substrate temperature may be varied from about room temperature to about 400° C.; in this series of experiments the substrate temperature was varied from about 100° C. to about 300° C. Selected deposition conditions and resultant film thicknesses are shown in Table 1. Film thickness was measured by imaging the film/substrate cross section with a Philips XL30 Series scanning electron microscope.

TABLE 1

Experimental Conditions for Pulsed Laser Ablation/Deposition of Nb-TMS1 Thin Films on TiN Coated Silicon

| Sample | Laser Fluence (MW/cm²) | Pressure (mTorr) | Substrate Temp. (° C.) | Deposition Time (min) | Film Thickness (nm) |
|---|---|---|---|---|---|
| 3A | 100 | 300 | 150 | 80 | 180 |
| 3B | 180 | 150 | 130 | 20 | 120 |
| 3C | 230 | 240 | 100 | 14 | 90 |
| 3D | 260 | 230 | 300 | 20 | 240 |
| 3B | 290 | 240 | 120 | 14 | 130 |
| 3F | 300 | 250 | 300 | 20 | 300 |
| 3G | 470 | 250 | 200 | 20 | 383 |
| 3H | 500 | 260 | 300 | 20 | 400 |
| 31 | 500 | 250 | 100 | 20 | 403 |
| 3J | 600 | 250 | 120 | 8 | 400 |

Figure 2:
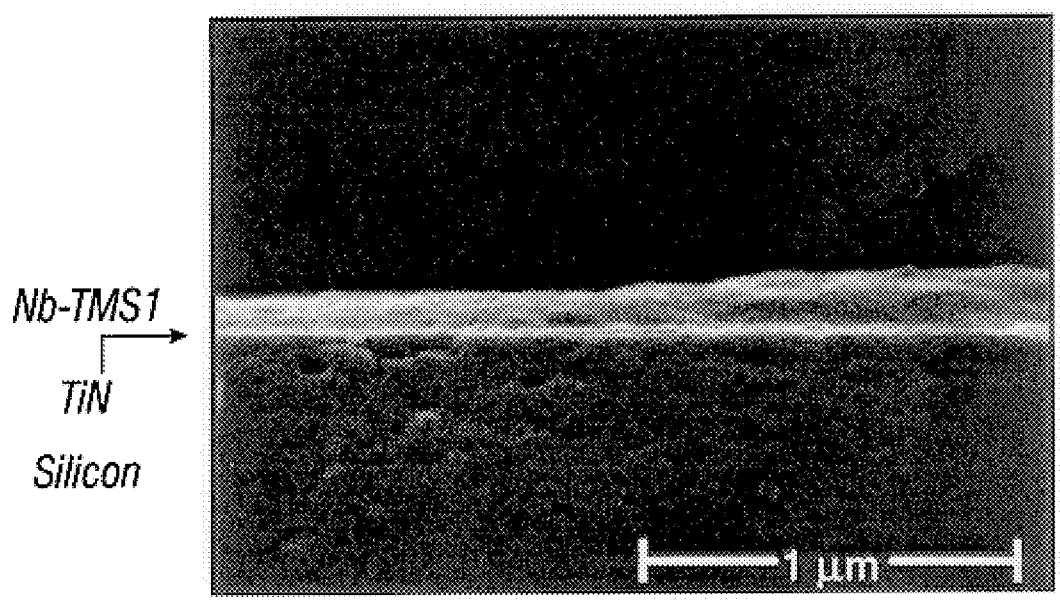
FIG. 2 is a SEM image showing a cross-section of a 240 nm thick film of niobium oxide.

All TiN/silicon substrates, with the exception of Examples 3C, 3E, 3I and 3J, were observed to be coated with a uniform, continuous layer of nanometer-scale particles having diameters of about 30 nm to about 250 nm. The film morphology of Examples 3C, 3E, 3I and 3J was observed to be non-uniform, discontinuous and/or "cratered" in appearance. A scanning electron microscope (SEM) image of the sample 3D niobium oxide film is shown in FIG. 1. A cross-sectional SEM image of the sample 3D film is shown in FIG. 2.

The as-deposited film consists of both organic template (dodecylamine) and niobium oxide and has the infrared frequencies shown in Table 2. The data in Table 2 demonstrate that this film material is structurally different from films obtained by pulsed laser ablation of dense phase, crystalline $Nb_2O_5$.

In Table 2, the infrared spectrum of the laser deposited Nb-TMS1 shows that the organic template present in the Nb-TMS1 target is transferred and incorporated into the laser deposited thin film. The presence of this organic template in the thin film is of importance to subsequent hydrothermal treatments which improve crystallinity. In addition, a comparison of the bands present in the region of the spectrum containing metal oxide stretching frequencies (1200-400 $cm^{-1}$) shows that the film deposited from Nb-TMS1 does not produce either the same number, position or relative intensity of bands compared to a laser deposited film from a dense phase $Nb_2O_5$ target. In both cases, infrared spectra suggest that the laser deposited thin film structures most closely resemble their respective targets.

TABLE 3

Experimental Conditions for Pulsed Laser Ablation/Deposition of Nb-TMS1 Thin Films on ITO Coated Glass

| Sample | Laser Fluence (MW/cm$^2$) | Pressure (mTorr) | Substrate Temperature (° C.) | Deposition Time (min) | Film Thickness (nm) |
|---|---|---|---|---|---|
| 4A | 40 | 300 | 230 | 20 | 60 |
| 4B | 40 | 320 | 240 | 20 | 60 |
| 4C | 50 | 340 | 230 | 15 | 50 |
| 4D | 70 | 320 | 220 | 10 | (<40) |
| 4B | 240 | 200 | 220 | 7 | 40 |
| 4F | 270 | 350 | 270 | 20 | 140 |

5.5 Example 5—Coating an ITO/MYLAR Substrate with a Mesoporous Thin Film

In this example, thin film-coated substrates are prepared via laser ablation/deposition in the manner described hereinabove. The ablation target was prepared from the mesoporous tungsten oxide molecular sieve prepared in accordance with Example 2. The laser ablated mesoporous material was collected on a ITO-coated MYLAR substrate.

The inventors presume that in this example the thickness of the deposited film varies depending on the amount of time the laser ablated material is collected. Because the films collected in this example are too thin to be resolved by a scanning electron microscope, their exact thickness was not determined. Other effective means of adjusting the film

TABLE 2

Infrared Characterization of Niobium Oxide Films Deposited from Nb-TMS1 and $Nb_2O_5$ Targets
(infrared frequences are in cm$^{-1}$; w = weak intensity; m = medium intensity; s = strong intensity)

| Nb-TMS1 Target | 2956[a] | 2921[a] | 2851[a] | | | | 905[b] (s) | 626[b] (s) | | | |
|---|---|---|---|---|---|---|---|---|---|---|---|
| Nb-TMS1 Film | 2958[a] | 2927[a] | 2853[a] | 1106[b] (w) | 1035[b] (w) | | 830[b] (m) | 631[b] (s) | | | |
| $Nb_2O_5$ Target | | | | | | 838[b] (s) | 753[b] (s) | 681[b] (s) | 557[b] (s) | 502[b] (s) | 419[b] (m) |
| $Nb_2O_5$ Film | | | | 1111[b] (m) | | | 872[b] (w) | 808[b] (w) | 595[b] (s) | 458[b] (m) | 419[b] (m) |

[a]These absorbances attributable to organic template
[b]These absorbances attributable to metal oxide

5.4 Example 4—Coating an ITO/Glass Substrate with a Mesoporous Thin Film

In this example, thin film-coated substrates are prepared via laser ablation/deposition in the manner described hereinabove. The ablation target was prepared from the Nb-TMS1 material prepared in accordance with Example 1. The laser ablated mesoporous material was collected on a indium-doped tin oxide (ITO) coated glass substrate.

In this example, the thickness of the deposited film varied from less than about 40 nm to about 140 nm, depending on the amount of time the laser ablated material was collected (see Table 3). Other effective means of adjusting the film thickness to the desired dimension include varying the laser fluence, target-to-substrate distance and background vacuum pressure.

The substrate temperature may be varied from about room temperature to about 600° C.; in this series of experiments the substrate temperature was varied from about 220° C. to about 270° C. Selected deposition conditions and resultant film thicknesses are shown in Table 3. Film thickness was measured by imaging the film/substrate cross section with a Philips XL30 Series scanning electron microscope.

thickness to the desired dimension include varying the laser fluence, target-to-substrate distance and background vacuum pressure.

Figure 3:
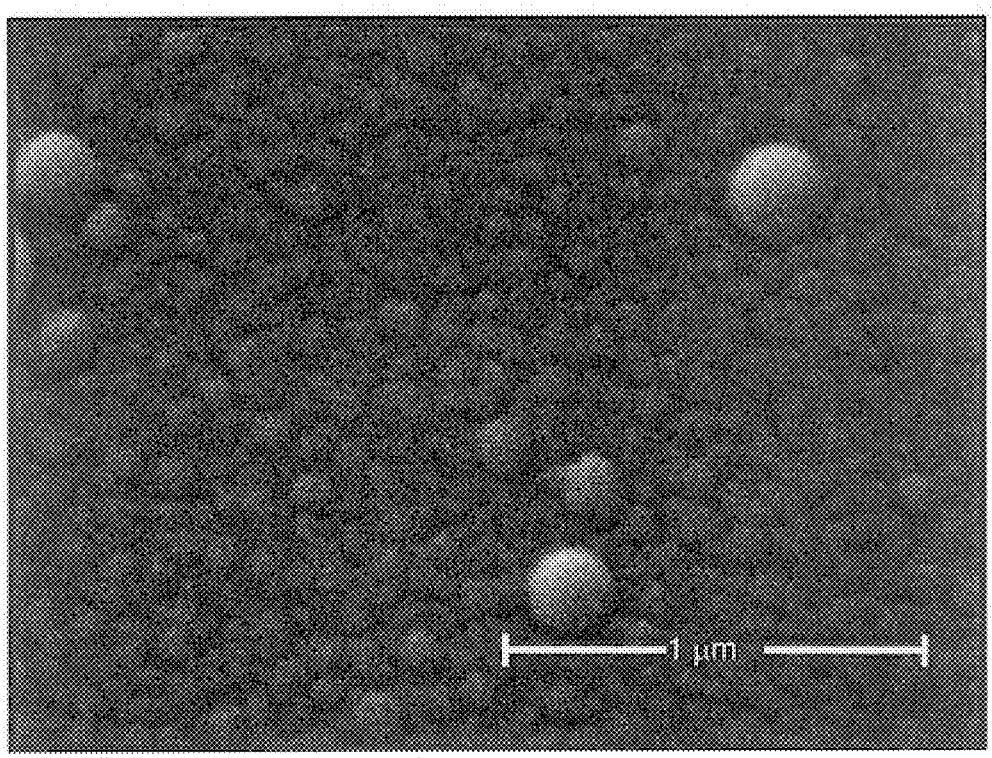
FIG. 3 is a SEM image of the surface morphology of a tungsten oxide film deposited by pulsed laser ablation of a mesoporous tungsten oxide target.

In this series of experiments the deposition time was varied from a few seconds to a few minutes. The substrate temperature may be varied from about room temperature to about 80° C.; in this example the substrate temperature was varied from about 32° C. to about 44° C. Selected deposition conditions are shown in Table 3. FIG. 3 shows a SEM image of the surface morphology of sample 5B. The thin films in this example were all transparent when viewed normal to the substrate surface, as is generally the case for all tungsten oxide films less than 100 nm in thickness.

TABLE 4

Experimental Conditions for Pulsed Laser Ablation/Deposition of Mesoporous Tungsten Oxide Thin Films

| Sample | Laser Fluence (MW/cm$^2$) | Pressure (mTorr) | Substrate Temperature (° C.) | Deposition Time (min) |
|---|---|---|---|---|
| 5A | 14 | 250 | 32 | 4 |
| 5B | 11 | 250 | 32 | 5 |

TABLE 4-continued

Experimental Conditions for Pulsed Laser Ablation/Deposition of Mesoporous Tungsten Oxide Thin Films

| Sample | Laser Fluence (MW/cm$^2$) | Pressure (mTorr) | Substrate Temperature (° C.) | Deposition Time (min) |
| --- | --- | --- | --- | --- |
| 5C | 9 | 250 | 32 | 3 |
| 5D | 14 | 250 | 44 | 0.72 |
| 5E | 14 | 275 | 44 | 1 |
| 5F | 14 | 250 | 38 | 1 |
| 5G | 14 | 250 | 37 | 1 |
| 5H | 14 | 250 | 32 | 1 |

5.6 Example 6—Enhancing Long Range Order of a Mesoporous Thin Film

Thin films prepared as in Examples 3, 4, and 5 may be poorly crystalline. In this example, a the crystallinity of a Nb-TMS1 thin film deposited on TiN/Si is enhanced by hydrothermal treatment in a sol gel mixture.

A niobium oxide thin film coated substrate was prepared as in Example 3 and was positioned in a 23 mL TEFLON liner at approximately a 60° angle, with the film side facing down. A sol gel mixture was then added to the TEFLON liner as follows: niobium ethoxide (1.0 g) and dodecylamine (0.292 g) were combined and poured into the Teflon liner, followed by 10 mL deionized water. The mixture was allowed to age for 72 h at room temperature, for 4 h at 90° C., for 4 h at 140° C., and for 24 h to 3 days at 180° C.

The niobium oxide film surface was transformed into a well adhered Nb-TMS1-like film. By "Nb-TMS1-like film" it is meant that the film exhibits the X-ray powder diffraction patterns that would be expected for Nb-TMS1 bulk material. Interestingly, little crystal growth occurred on the uncoated portion of the TiN surface which was also exposed to the Nb-TMS1 precursor sol gel mixture. Selected examples for which hydrothermal treatment has been performed are shown along with resultant film thicknesses in Table 5.

TABLE 5

Experimental Conditions for Hydrothermal Treatment of Niobium Oxide Thin Films Deposited by Pulsed Laser Ablation of Mesoporous Nb-TMS1 Targets

| Sample | Niobium ethoxide: dodecylamine | Days Aging at 180° C. | Initial Film Thickness (nm) | Final Film Thickness (nm) | $d_{100}$ present ? |
| --- | --- | --- | --- | --- | --- |
| 6A | 1.307 g:0.3046 g | 2.5 | 300 | 330 | no |
| 6B | 1.0307 g:0.3046 g | 2.5 | 240 | 300 | no |
| 6C | 1.0327 g:0.3110 g | 3 | 400 | 10000 | yes |
| 6D | 1.0327 g:0.3110 g | 3 | 383 | 7000 | yes |
| 6B | 1.0327 g:0.3110 g | 3 | 403 | 13000 | yes |

Figure 4:
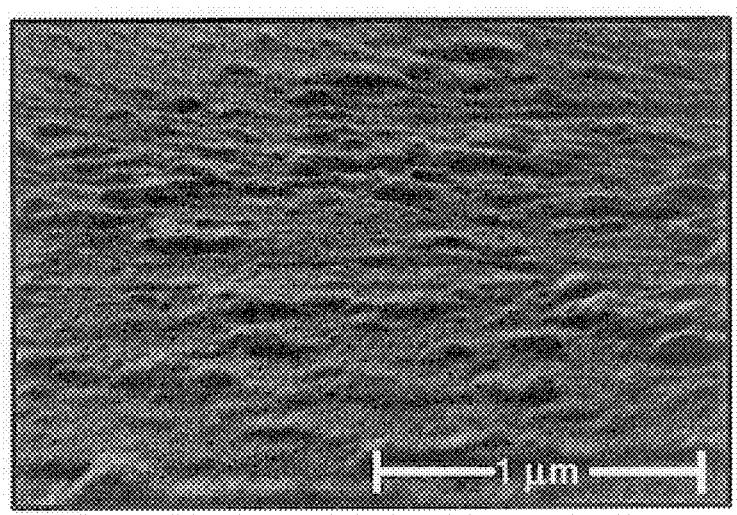
FIG. 4 shows a SEM image of a hydrothermally treated Nb-TMS1 film.

The X-ray diffraction pattern of the hydrothermal treated films of Example 6C–6E includes a very strong relative intensity line at 28.7±0.3 Å d-spacing. FIG. 4 shows a SEM micrograph of the sample 6A hydrothermally treated film.

5.7 Example 7—Capacitive-Type Chemical Sensor

In this example, a functioning capacitive-type chemical sensor is prepared from a hydrothermally treated/template-free mesoporous niobium oxide thin film which has been coated onto a TiN/Si substrate.

A hydrothermally treated thin film was prepared as in Example 6 and the organic template was removed by washing in a solution of 3:1 isopropanol:water acidified with HNO$_3$ to pH 1.75 for 3 h, followed by washing in ethanol. A 0.184 mm$^2$ Au/Pd alloy electrode was patterned onto the film surface using a shadow mask. The device was then heated to 200° C. to desorb water and immediately transferred to an environmental chamber under a positive pressure of high purity nitrogen where it was allowed to cool to room temperature (24° C.).

The environmental chamber was equipped with two probes by which the film plus adsorbate capacitance was measured. One probe made electrical contact with the bare TiN surface and the other made contact with the Au/Pd electrode. A voltage was applied and the capacitance signal was received by a WayneKerr Precision Component Analyzer 6425. A virtual instrument program written in-house, using LabVIEW for Windows 3.0.1, allowed the applied voltage to be stepped from 0 V to 0.300 V and the measured capacitance plotted as a function of voltage.

Figure 5:
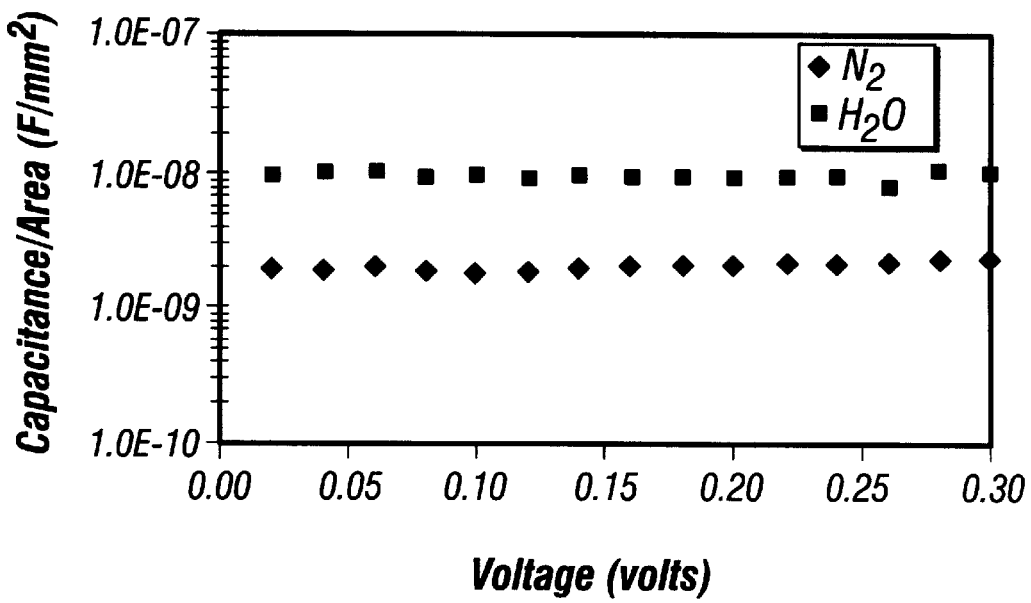
FIG. 5 illustrates the capacitance change observed when a chemical sensor comprising a 300 nm thick Nb-TMS1 film is exposed to water vapor.

The presence of water was detected with this chemical sensor. When the sensor was subjected to a flow of gas containing water vapor, the capacitance measured across the hydrothermally treated thin film increased as the H$_2$O was adsorbed/absorbed. FIG. 5 illustrates the capacitance change observed for a chemical sensor comprising a 300 nm thick film upon exposure to high purity nitrogen and water vapor. Absorption of nitrogen yielded a measured capacitance on the order of $10^{-9}$ F/mm$^2$. An increase in capacitance was observed upon exposure to water vapor ($10^{-8}$ F/mm$^2$). Small organic molecules such as acetone and methanol did not interfere.

Figure 6:
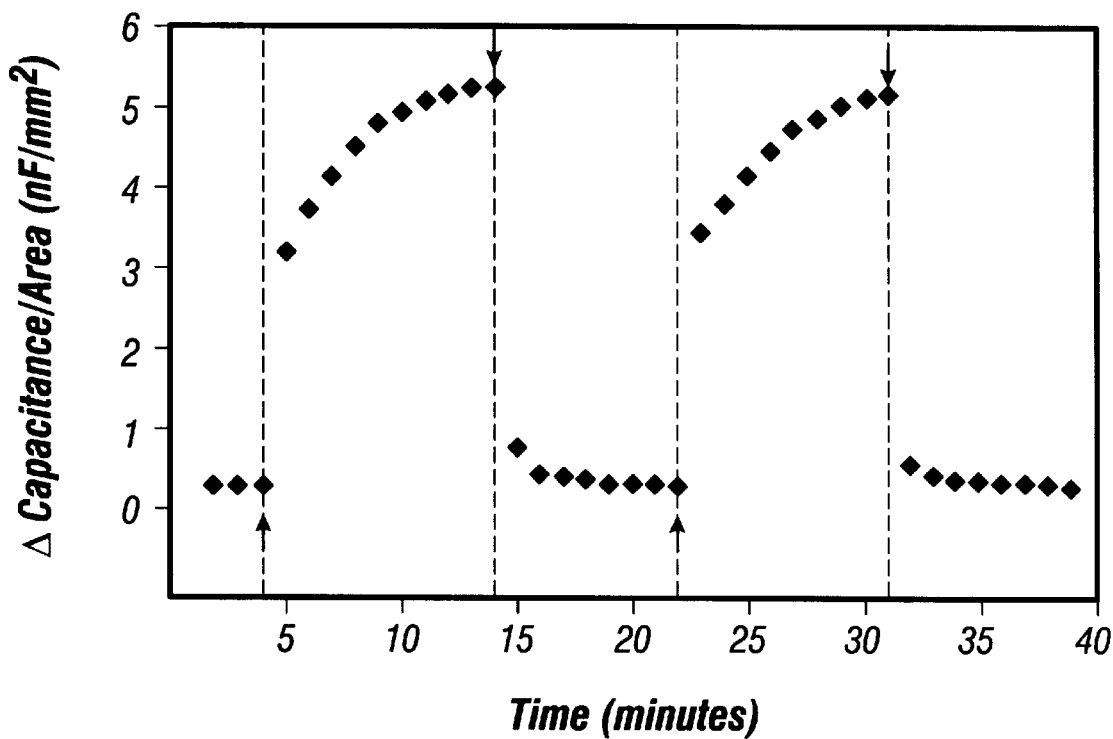
FIG. 6 shows the average reversible response of a capacitive-type Nb-TMS1 chemical sensor in the presence of water vapor.

Water can move freely into and out of the pores of the hydrothermally treated thin film, and the capacitive response can be monitored over a period of time. For example, FIG. 6 illustrates the reversible response to water of devices comprising mesoporous niobium oxide thin films which are approximately 300 nm thick.

5.8 Example 8—Electrochromic Device

In this example, a functioning electrochromic device is manufactured from a film of tungsten oxide on an ITO-coated MYLAR substrate. The electrochromic properties of the mesoporous tungsten oxide thin film are then tested experimentally by setting up an electrochemical cell.

A film of mesoporous tungsten oxide was prepared as in Example 5. The mesoporous tungsten oxide thin film on ITO-coated MYLAR served as the working electrode, a silver wire served as the reference electrode and a carbon rod served as the counterelectrode. A solution of 1M LiClO$_4$ in acetonitrile served as a source of Li$^+$ cations. A voltage was applied across the working (−) and counter (+) electrodes using an EG&G Princeton Applied Research Potentiostat/Galvanostat Model 263A. The thin film exhibited a color change (dark blue) when −0.80 V (versus silver wire) was applied to the working electrode. Application of +1.0 V caused the mesoporous tungsten oxide thin film to become colorless.

Figure 7:
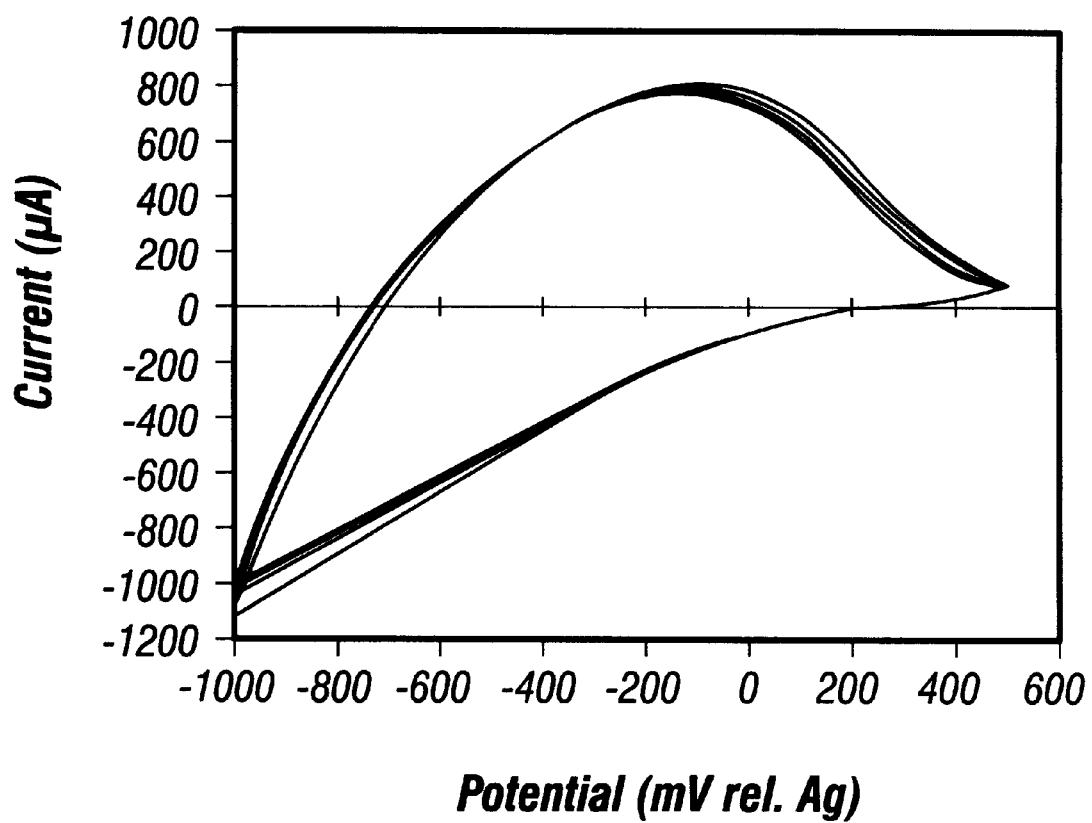
FIG. 7 shows the cyclic voltammogram obtained for an as-deposited tungsten oxide film on ITO-coated MYLAR (scan rate 50 mV/s).

FIG. 7 shows that the tungsten oxide film generated by ablating mesoporous tungsten oxide can be cycled through reduction/oxidation of the tungsten metal centers; the cyclic voltammogram was obtained at a scan rate of 50 mV/s.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

6.0 REFERENCES

The following references, to the extent that they provide exemplary procedural or other details supplementary to those set forth herein, are specifically incorporated herein by reference.

Aksay, Trau, Manne, Honma, Yao, Zhou, Fenter, Eisenberger, Gruner, "Biomimetic Pathways for Assembling Inorganic Thin Films," *Science,* 273:892–898, 1996.

Antonelli, Nakahira, Ying, "Ligand-Assisted Liquid Crystal Templating in Mesoporous Niobium Oxide Molecular Sieves," *Inorg. Chem.,* 35:3126–3136, 1996.

Antonelli and Ying, "Mesoporous Materials," *Curr. Opin. Colloid and Interface Sci.,* 523–529, 1996.

Balkus, Jr., Riley, Gnade, "Molecular Sieve Thin Films via Laser Ablation," *Mat. Res. Soc. Symp. Proc.,* 351:437–442, 1994.

Balkus, Jr., Sottile, Nguyen, Riley, Gnade, "Molecular Sieve Based Chemical Sensors," *Mat. Res. Soc. Symp. Proc.,* 371:33–38, 1995.

Beck, Vartuli, Roth, Leonowicz, Cresge, Schmitt, Chu, Olson, Sheppard, McCullen, Higgins, Schlenker, "A New Family of Mesoporous Molecular Sieves Prepared with Liquid Crystal Templates," *J. Am. Chem. Soc.,* 114:10834–10843, 1992.

Cheung and Sankur, "Growth of Thin Films by Laser-Induced Evaporation," *CRC Crit.*

Rev. Solid State Mat. Sci., 15(1):63–109, 1988.

Ciesla, Demuth, Leon, Petroff, Stucky, Unger, Schüith, "Surfactant Controlled Preparation of Mesostructured Transition-Metal Oxide Compounds," *Chem. Soc., Chem. Commun.,* 1387–1388, 1994.

Kurioka, Watanabe, Haneada, Shimanouchi, Mizushima, Kakuta, Ueno, Hanaoka, Sugi, "Preparation of Niobium Oxide Films as a Humidity Sensor," *Catalysis Today,* 16:495–501, 1993.

Ogawa, "Formation of Novel Oriented Transparent Films of Layered Silica-Surfactant Nanocomposites," *J. Am. Chem. Soc.,* 116:7941–7942, 1994.

Peachey, Dye, Ries, Warren, Olken, "Pulsed Laser Deposition of Zeolitic Thin Films: Novel Structures for Molecular Recognition," *J. Porous Mat.,* 2:331–336, 1996.

Sottile, Balkus, Jr., Riley, Gnade, "Molecular Sieve Based Chemical Sensors," *Mat. Res. Soc. Symp. Proc.,* 351:263–268, 1994.

Yang, Coombs, Sokolov, Ozin, "Free-Standing and Oriented Mesoporous Silica Films Grown at the Air-Water Interface," *Nature,* 381:589–592, 1996.

U.S. Pat. No. 5,364,797

What is claimed is:

1. A mesoporous transition metal oxide thin film between about 10 nm and about 100 μm in thickness, wherein the transition metal oxide comprises an oxide of at least one of Nb, Ti, Ta, Zr, Ce, W, Mo, Fe, or Pb.

2. The thin film of claim 1, further defined as between about 200 nm and about 300 nm in thickness.

3. The thin film of claim 1, further defined as between about 10 nm and about 50 nm in thickness.

4. The thin film of claim 1, wherein the transition metal oxide comprises at least one of Nb-TMS1, Ti-TMS1, Ta-TMS1, Zr-TMS1, OR Ce-TMS1, where the term TMS1 refers to a family of hexagonally packed mesoporous transition metal oxide molecular sieves prepared via a liquid crystal tempting process.

5. The thin film of claim 1, further defined as being about 50 nm in thickness.

6. The thin film of claim 1, further defined as being about 250 nm in thickness.

7. A mesoporous transition metal oxide thin film, which is between about 10 nm and about 100 μm in thickness, wherein the transition metal oxide comprises an oxide of at least one of Nb, Ti, Ta, Zr, Ce, W, Mo, Fe, or Pb, said film produced by a process comprising:

a) placing a mesoporous transition metal oxide target under a pressure between about 0.01 mTorr and about 600 mTorr;

b) directing a laser beam upon said target under conditions to ablate the target; and c) depositing the ablated target on a substrate to form a continuous uniform mesoporous transition metal oxide film having a thickness of between about 10 nm and 100 μm upon said substrate.

8. The thin film of claim 7, wherein the thin film is between about 10 nm and about 50 nm in thickness.

9. The thin film of claim 7, wherein the substrate comprises titanium nitride-coated silicon.

10. The thin film of claim 7, wherein the substrate comprises indium-doped tin oxide-coated glass.

11. The thin film of claim 7, wherein the substrate comprises indium-doped tin oxide-coated polyester.

12. The thin film of claim 7, wherein the pressure is between about 150 mTorr and about 300 mTorr.

13. The thin film of claim 7, wherein the substrate is heated to a temperature between about room temperature and about 600° C.

14. The thin film of claim 7, wherein the substrate is located below the target at a distance of about 2 cm to about 5 cm.

15. The thin film of claim 7, wherein the pressure is adjusted using a needle valve and an oxygen source.

16. The thin film of claim 7, wherein the laser beam is emitted by a pulsed excimer laser.

17. The thin film of claim 16, wherein the pulsed excimer laser emits 14 ns pulses of radiation at a wavelength of about 248 nm, at a laser fluence of between about 9 MW/cm$^2$ and about 600 MW/cm$^2$.

18. The thin film of claim 7, wherein the laser beam is scanned across the target by means of a rastering mirror such that fresh target material is ablated with each laser pulse.

19. The thin film of claim 7, further comprising enhancing the crystallinity of the thin film by treating it in a heated sol gel mixture comprising a transition metal source and a templating agent.

20. The thin film of claim 19, wherein the heated sol gel mixture is aqueous, the transition metal source is a transition metal alkoxide, and the templating agent is an amine containing an alkyl chain.

21. The thin film of claim 20, wherein the transition metal source is niobium ethoxide and the templating agent is dodecylamine.

22. The thin film of claim 19, wherein the thin film is aged in the heated sol gel mixture for between about 1 and about 3 days at a temperature of about 180° C.

23. The thin film of claim 7, further comprising the removal of the templating agent with an acid wash.

* * * * *

UNITED STATES PATENT AND TRADEMARK OFFICE
CERTIFICATE OF CORRECTION

PATENT NO. : 6,120,891
DATED : September 19, 2000
INVENTOR(S) : Balkus, Jr. et al.

It is certified that error appears in the above-identified patent and that said Letters Patent is hereby corrected as shown below:

On the title page, item [73], Assignee, please delete "Regemts." and insert -- Regents, -- therefor.

Signed and Sealed this

Fifteenth Day of May, 2001

Attest:

NICHOLAS P. GODICI

Attesting Officer

Acting Director of the United States Patent and Trademark Office